(12) United States Patent
Concil et al.

(10) Patent No.: US 7,770,092 B2
(45) Date of Patent: Aug. 3, 2010

(54) METHOD FOR ITERATIVE DECODING IN A DIGITAL SYSTEM AND APPARATUS IMPLEMENTING THE METHOD

(75) Inventors: Andrea Concil, Novara (IT); Andrea Giorgi, Busto Arsizio (IT); Stefano Valle, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1122 days.

(21) Appl. No.: 11/323,909

(22) Filed: Dec. 29, 2005

(65) Prior Publication Data

US 2007/0157063 A1 Jul. 5, 2007

(51) Int. Cl.
*H03M 13/03* (2006.01)
(52) U.S. Cl. ............... 714/794; 714/752; 714/795; 714/796; 375/262; 375/341
(58) Field of Classification Search ........... 714/752, 714/794–796; 375/262, 341
See application file for complete search history.

(56) References Cited

U.S. PATENT DOCUMENTS

| | | | |
|---|---|---|---|
| 6,298,463 B1 | 10/2001 | Bingeman et al. | |
| 7,246,295 B2 * | 7/2007 | Xu | 714/755 |
| 2003/0056167 A1 * | 3/2003 | Yuan et al. | 714/759 |
| 2003/0091129 A1 * | 5/2003 | Zhang et al. | 375/340 |
| 2005/0052991 A1 * | 3/2005 | Kadous | 370/216 |

OTHER PUBLICATIONS

Bahl, L.R. et al., "Optimal Decoding of Linear Codes for Minimizing Symbol Error Rate," IEEE Transactions on Information Theory, Mar. 1974, pp. 284-287.
Berrou, C. et al., "Near Shannon Limit Error-Correcting Coding and Decoding: Turbo-Codes (1)," IEEE International Conference on Communications, Geneva, Switzerland, 1993, pp. 1064-1070.
Robertson, P. et al., "A Comparison of Optimal and Sub-Optimal MAP Decoding Algorithms Operating in the Log Domain," IEEE International Conference on Communications, Seattle, Washington, Jun. 1995, pp. 1009-1013.

* cited by examiner

*Primary Examiner*—Esaw T Abraham
(74) *Attorney, Agent, or Firm*—Lisa K. Jorgenson; Robert Iannucci; Seed IP Law Group PLLC (57) ABSTRACT

In a digital system using a turbo code, a method for performing iterative decoding in accordance with a Log-MAP Algorithm comprises the steps of:—generating a look-up table comprising a plurality of values representative of a correcting factor;—performing a first calculation to obtain a forward metric;—performing a second calculation to obtain a backward metric;—performing a third calculation to obtain a log-likelihood ratio for every information bit to be decoded. In accordance with the method, at least one and no more than two of such calculations are performed by the use of said look-up table for implementing the Log-MAP decoding algorithm and the remaining calculations are performed implementing a Max-Log-MAP decoding algorithm.

26 Claims, 7 Drawing Sheets

METHOD FOR ITERATIVE DECODING IN A DIGITAL SYSTEM AND APPARATUS IMPLEMENTING THE METHOD

FIELD OF INVENTION

The present invention relates to the field of error correction codes such as the ones employed for wireline and wireless digital communication systems and in data storage systems. More particularly, the present invention relates to iterative decoding methods that implement the Maximum A Posteriori (MAP) Algorithm.

BACKGROUND OF THE INVENTION

A digital communication system of both wireless and wireline type usually comprises a transmitter, a communication channel and a receiver as known by those skilled in the art.

The communication channel of such system is often noisy and introduces errors in the information being transmitted such that the information received at the receiver is different from the information transmitted.

In general, in order to correct an error of the channel transmitted through wireline and wireless environments, the digital communication system uses a protection method by which the transmitter performs a coding operation using an error correction code and the receiver corrects the error produced by the noisy channel.

Various coding schemes have been proposed and developed for performing correction of errors introduced by the channel. In particular, turbo codes, which are Forward Error Correction (FEC) codes, are capable of achieving better error performance than conventional codes. Furthermore, turbo codes can achieve exceptionally low error rates in a low signal-to-noise ratio environment.

For this reason, such turbo codes can usefully be employed in wireless communications, for example in the more recent CDMA wireless communication standard.

A detailed description of turbo coding and decoding schemes can be found in "*Near Shannon limit error-correcting coding and decoding: Turbo-codes*", Berrou et al., Proc., IEEE Int'l Conf. On communications, Geneva, Switzerland, 1993, pp. 1064-1070, Particularly, turbo codes are the parallel concatenation of two or more recursive systematic convolutional codes separated by interleavers.

As known by those skilled in the art, decoding of turbo codes is often complex and involves a large amount of complex computations. Turbo decoding is typically based on a Maximum A Posteriori (MAP) algorithm which operates by calculating the maximum a posteriori probabilities for the data encoded by each constituent code.

While it has been recognized that the MAP algorithm is the optimal decoding algorithm for turbo codes, it is also recognized that implementation of the MAP decoding algorithm is very difficult in practice because of its computational complexities.

To reduce such complexities, approximations and modifications to the MAP algorithm have been developed. These include a Max-Log-MAP algorithm and a Log-MAP algorithm.

The Max-Log-MAP and Log-MAP algorithms are described in detail in "*A Comparison of Optimal and Sub-Optimal MAP Decoding Algorithms Operating in the Log Domain*", Robertson et al., IEEE Int'l Conf. on Communications (Seattle, Wash.), June, 1995.

To reduce the computational complexity of the MAP algorithm, the Max-Log-MAP and Log-MAP algorithms perform the entire decoding operation in the logarithmic domain. In fact, in the logarithmic domain, multiplication operations become addition operations, thus simplifying numeric computations involving multiplication.

SUMMARY OF THE INVENTION

The object of the present invention is to provide an improved method for performing iterative decoding in accordance with a Log-MAP algorithm in a digital system using a turbo code.

Particularly, the inventive method comprises the steps of:
generating a look-up table comprising a plurality of values corresponding to a transcendent function representative of a correcting factor of a max* algorithm;
performing a first calculation to obtain a forward metric;
performing a second calculation to obtain a backward metric;
performing a third calculation to obtain a log-likelihood ratio for every information bit to be decoded.

Furthermore, among such performed calculations at least one and no more than two calculations are performed by the use of the look-up table for implementing the Log-MAP decoding algorithm and the remaining calculations are performed implementing a Max-Log-MAP decoding algorithm.

Another object of the invention is a receiving apparatus which comprises a decoder for performing iterative decoding of information coded by an error correction code.

The decoder comprises:
a memory storing a look-up table comprising a plurality of tabled values;
a processor module for retrieving said tabled values from the look-up table.

BRIEF DESCRIPTION OF THE DRAWINGS

The characteristics and the advantages of the present invention will be understood from the following detailed description of an exemplary non-limiting embodiment thereof with reference to the annexed figures, in which.

DETAILED DESCRIPTION OF THE PREFERRED EMBODIMENTS

Figure 1:
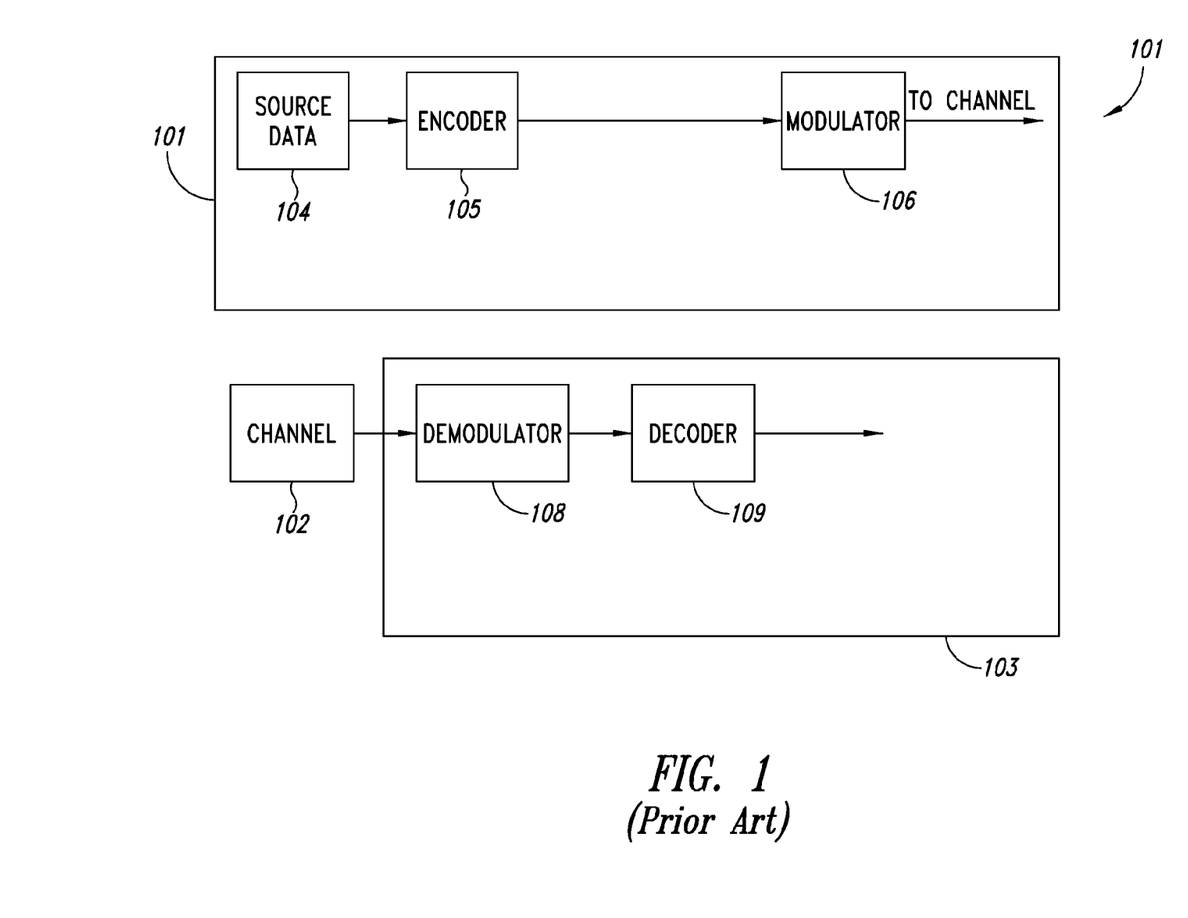
FIG. 1 schematically shows in a block diagram an exemplary digital communication system.

FIG. 1 is a block diagram schematically showing an exemplary digital communication system 100 of both wireless and wireline type. It has to be observed that the present invention is also applicable to data storage systems.

Particularly, the communication system 100 comprises a transmitter 101, a communication channel 102 and a receiver apparatus 103. The transmitter 101 comprises a source 104 of digital data and an encoder 105 to encode data in order to make the transmission more robust against errors introduced by the channel 102. Furthermore, the transmitter 101 comprises a modulator 106 to translate the encoded bits into signals suitable to be transmitted through the channel 102.

Instead, the receiver apparatus 103 comprises a demodulator 108 for translating the received signals into bit likelihoods or soft values indicating the probability of a received bit to be a 0 or 1 logic. Subsequently, such soft values are elaborated by a decoder 109 that retrieves the source bits.

In order to avoid errors introduced by the noisy channel 102, the data bits to be transmitted can be, advantageously, encoded using a PCCC (Parallel Concatenated Convolutional Coding) turbo code known in the art.

Particularly, employing the PCCC turbo code in the digital communication system 100, data bits to be transmitted over the communication channel 102 are encoded as an information sequence (also called systematic information) and as two or more parity sequences (also called parity information).

Figure 2:
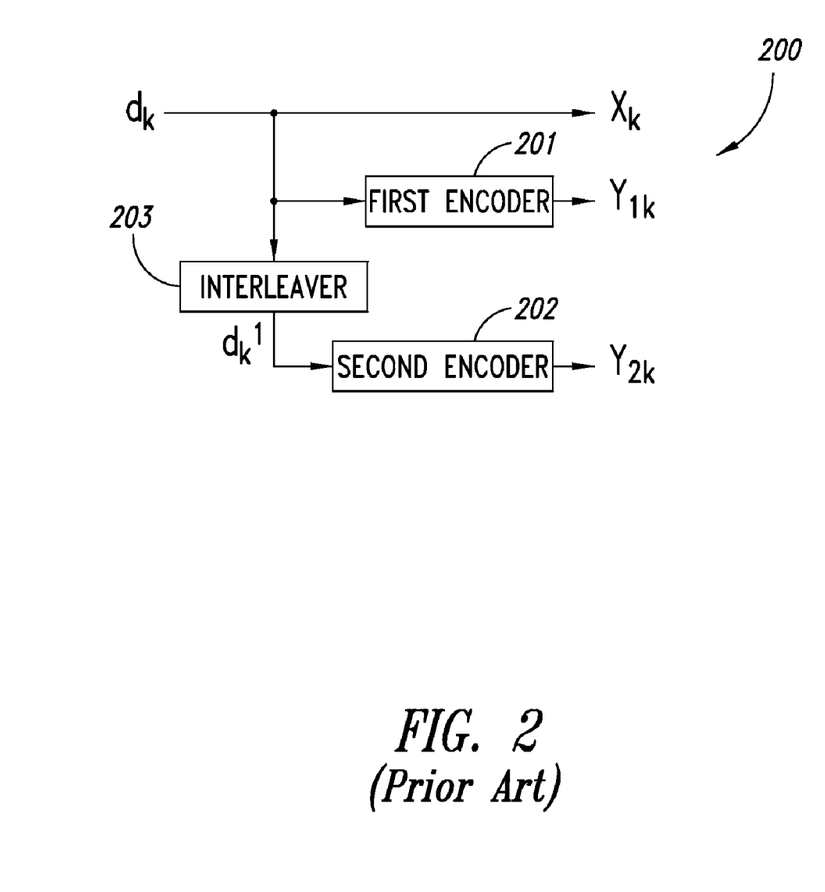
FIG. 2 schematically shows an exemplary encoder for a PCCC turbo code comprised in the system of FIG. 1.

FIG. 2 shows schematically an example of a PCCC turbo encoder 200 which can be comprised in the transmitter 101 of the communication system 100.

Particularly, such encoder 200 comprises a first 201 and a second 202 encoder, for example, substantially equal each other. The encoders 201 and 202 are chosen among the Recursive Systematic Convolutional codes (RSC) and are described in "*Near Shannon limit error-correcting coding and decoding: Turbo-codes*", Berrou et al., Proc., IEEE Int'l Conf. On communications, Geneva, Switzerland, 1993, pp. 1064-1070 and in U.S. Pat. No. 6,298,463 B1 (Bingeman et al.), herein enclosed by reference.

With reference to a first information bit sequence $d_k$ which corresponds to the data to be transmitted, the PCCC encoder 200 generates a systematic sequence of bits $X_k$, a first parity sequence $Y_{1k}$ and a second parity sequence $Y_{2k}$.

As shown in FIG. 2, the systematic sequence $X_k$ corresponds to the first information bit sequence $d_k$. Moreover, such bit sequence $d_k$ represents the input of the first encoder 201 which produces at its output the first parity sequence $Y_{1k}$.

On the contrary, a second information bit sequence $d_k^1$ corresponds to the first information bit sequence $d_k$ after elaboration made by an interleaver 203, Such second information bit sequence $d_k^1$ represents the input of the second encoder 202 which produces the second parity sequence $Y_{2k}$ at its output.

The interleaver 203 in the PCCC turbo code encoder 200 operates, as it is known, to interleave the information bits supplied to the same encoder 200, Such interleaving operation can be accomplished, for example, storing all input information bits consecutively in the rows of a matrix of storage locations and then reading consecutively the columns of the same matrix to access the stored bits (row-column interleaver).

It should be observed that, typically, in the PCCC encoder 200, the interleaver 203 is embedded into the encoder structure to form an overall concatenated code. In more detail, the interleaver 203 is employed to decorrelate the decoding errors produced in the first convolutional code (i.e. the first encoder 201) from those coming from the second convolutional code (i.e. the second encoder 202).

The systematic sequence of bits $X_k$, the first $Y_{1k}$ and second $Y_{2k}$ parity sequences produced by the PCCC encoder 200 are then multiplexed to form a code word. After encoding, the code word is modulated according to techniques known in the art and transmitted over the noisy communication channel 102, either wired or wireless.

Figure 3:
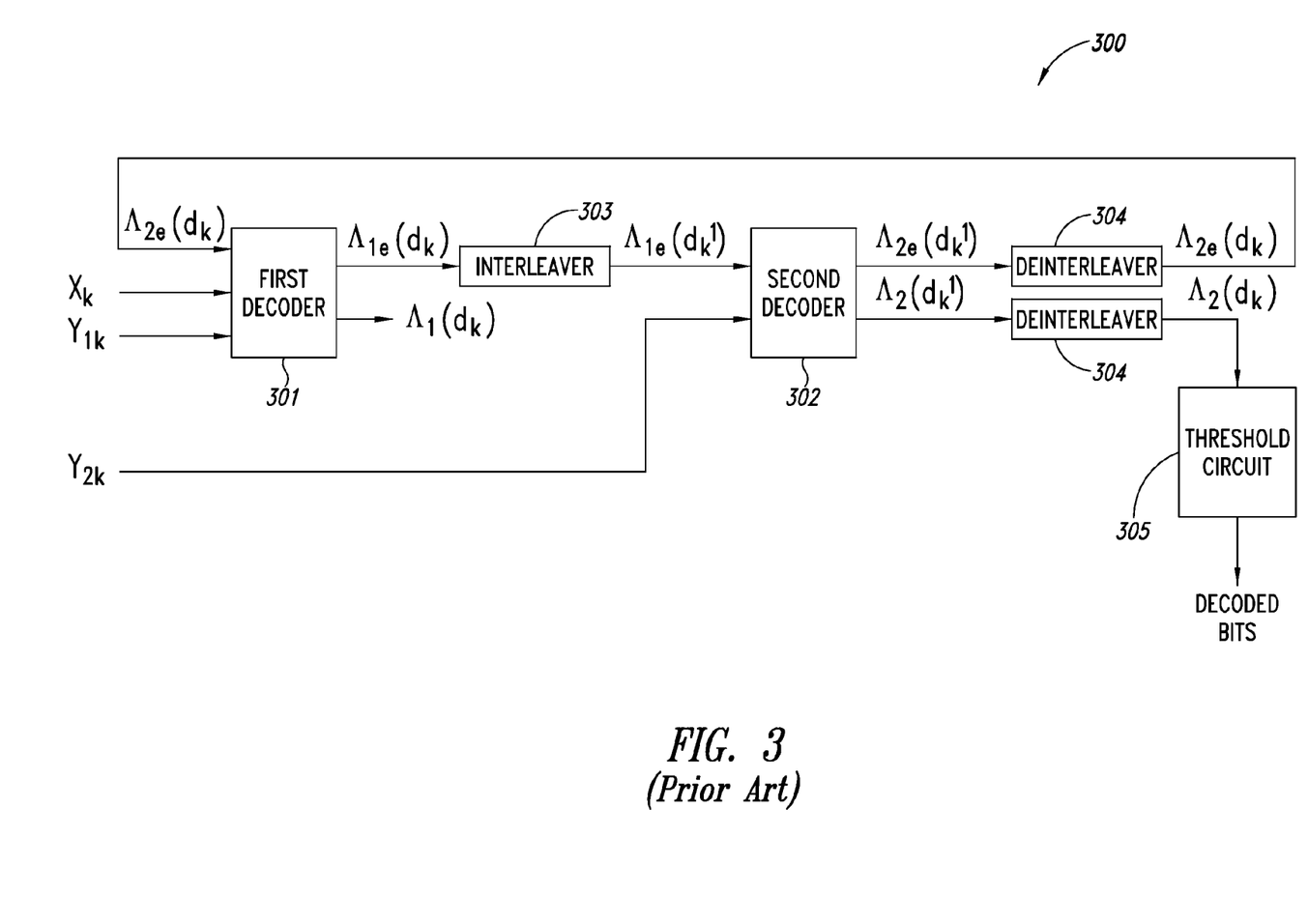
FIG. 3 schematically shows an exemplary decoder for a PCCC turbo code comprised in the system of FIG. 1.

FIG. 3 is a block diagram schematically showing the structure of a general PCCC turbo decoder 300 included in the receiver apparatus 103 of the communication system 100.

In more detail, such decoder 300 comprises a first 301 and a second 302 decoder for receiving and decoding the soft values $x_k$, $y_{1k}$ and $y_{2k}$ produced by the demodulator 108 of the receiver apparatus 103. Such soft values $x_k$, $y_{1k}$ and $y_{2k}$ correspond to the systematic bit $X_k$, the first parity bit $Y_{1k}$ and the second parity bit $Y_{2k}$, respectively, which have been demodulated and then filtered and sampled by, for example, a suitable Filter/Match/Sample unit not shown in FIG. 3.

Moreover, the PCCC turbo decoder 300 can be constructed as an application specific integrated circuit (ASIC) or as a field-programmable gate-array (FPGA) or a digital signal processor (DSP) software or using other suitable technologies known by one skilled in the art.

As can be seen, the soft values $x_k$ and $y_{1k}$ corresponding to the systematic bit $X_k$ and the first parity bit $Y_{1k}$, represent the inputs of the first decoder 301. The output of the first decoder 301 is a first log-likelihood ratio $\Lambda_{1e}(d_k)$ to be sent to the second decoder 302 through a first interleaver 303. Such first interleaver 303 is analogous to the interleaver 203 of the PCCC encoder 200.

Moreover, a first interleaved log-likelihood ratio $\Lambda_{1e}(d_k^1)$ represents a first input of the second decoder 302 and the soft value $y_{2k}$ corresponding to the second parity bit $Y_{2k}$ represent a second input for the same decoder 302.

Furthermore, a second interleaved log-likelihood ratio $\Lambda_{2e}(d_k^1)$ produced at the output of the second decoder 302 represents the input of a deinterleaver 304 in order to generate a deinterleaved log-likelihood ratio $\Lambda_{2e}(d_k)$ to be sent to the first decoder 301 as a feedback signal.

As known by those skilled in the art, the log-likelihood ratios $\Lambda_{1e}(d_k)$ and $\Lambda_{2e}(d_k^1)$ produced at the output of the first 301 and second 302 decoders are the so called "extrinsic information". Such extrinsic information $\Lambda_{1e}(d_k)$, $\Lambda_{2e}(d_k^1)$ each one feeding the successive decoder in an iterative fashion is used as an estimation of the "a priori probability" of the logic value (0 or 1) of information bits. The first interleaver 303 and the deinterleaver 304 reorder the extrinsic information $\Lambda_{1e}(d_k)$ and $\Lambda_{2e}(d_k^1)$, respectively, before each exchange between the first 301 and 302 second decoders.

The reliability of the estimation increases for each iterative decoding step and determines the number of iterations to be carried out. Finally, a hard decision on the information bits is taken at the end of the last iteration. Particularly, at the last step of iteration, a further deinterleaver 304' deinterleaves the second log-likelihood ratio $\Lambda_{2e}(d_k^1)$ produced by the second decoder 302 and the decoded bits are provided at the output of a threshold circuit 305, According to the described example, the first 301 and second 302 decoders are identical for the PCCC Turbo decoder 300 of the invention. Such decoders 301 and 302 can operate using different algorithms of the type Maximum A Posteriori (MAP).

As example, the first 301 and second 302 decoders can implement a MAP algorithm, such as the one proposed by Bahl et al in "*Optimal decoding of linear codes for minimizing symbol error rate*", IEEE Trans. Inform. Theory, vol. IT-20, pp. 248-287, March 1974, herein enclosed by reference.

Particularly, the first 301 and the second 302 decoders can employ the MAP algorithms in the forms "Log-MAP" and "Max-Log-MAP" algorithms, which are described in "*A Comparison of Optimal and Sub-Optimal MAP Decoding Algorithms Operating in the Log Domain*", Robertson et al., IEEE Int'l Conf. on Communications (Seattle, Wash.), June, 1995, herein enclosed by reference.

More particularly, as it will be described hereinafter, the first decoder 301 can perform at least one calculation in accordance with the "Log-MAP" algorithm.

Figure 4:
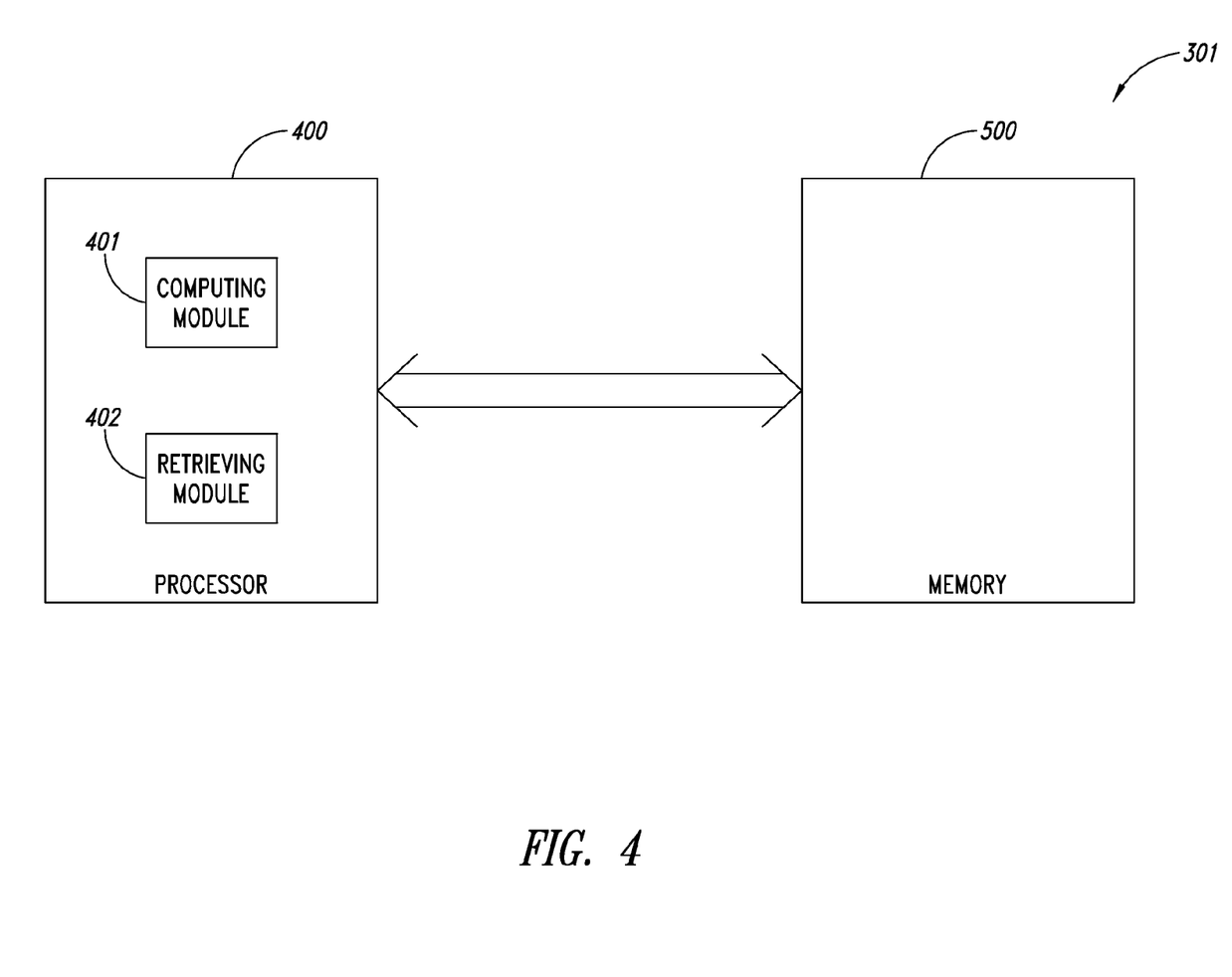
FIG. 4 schematically shows an architecture of a decoder block included in the decoder of FIG. 3.

FIG. 4 shows schematically a block diagram of the first decoder 301 comprised in the PCCC turbo decoder 300 in accordance with an example of the invention.

Such first decoder 301 may comprise a processor unit 400 for performing the decoding processing and a memory unit 500 which can be written and read by the processor unit 400. In more detail, the processor unit 400 may comprise a computation module 401 for performing calculations and a retrieving module 402 for retrieving data from the memory unit 500. The modules 400, 401, 402 and the memory 500 may be hardware and/or software modules exclusively dedicated to perform the functions of the first decoder 301, For example, the computation module 401 may be a microprocessor (Central Processing Unit or CPU) or other kinds of processing units. Further, the memory unit 500 may include a Read Only Memory (ROM).

Preferably, the units of the architecture shown in FIG. 4 can also be so as to perform not only the functions of the first decoder 301 but also the functions of the second decoder 302 or the ones of the whole decoder 300.

Following, an example of the inventive decoding method provided by the PCCC turbo decoder 300 will be described. Particularly, such turbo decoder 300 operates in accordance with the Log-MAP algorithm.

Further details on the mathematical bases of the inventive method can be found in the above mentioned paper "*Near Shannon limit error-correcting coding and decoding: Turbocodes*", Berrou et al., Proc., IEEE Int'l Conf. On communications, Geneva, Switzerland, 1993, pp. 1064-1070.

Particularly, the first decoder 301 computes the A Posteriori Probability in logarithmic domain. The output of such decoder 301, i.e. the first log-likelihood ratio $\Lambda_1(d_k)$, can be expressed as:

$$\Lambda_1(d_k) = \log \frac{P_r(d_k = 1 / \text{observation})}{P_r(d_k = 0 / \text{observation})} \quad (1)$$

$$= \log \frac{\sum_m \sum_{m'} \sum_{j=0}^{1} \gamma_1(R_k, m', m) \alpha_{k-1}^j(m') \beta_k(m)}{\sum_m \sum_{m'} \sum_{j=0}^{1} \gamma_0(R_k, m', m) \alpha_{k-1}^j(m') \beta_k(m)}$$

where m and m' are the trellis states (known to the skilled person) at time k and k−1, respectively. Moreover, values $\alpha$, $\beta$ and $\gamma$ are usually called Forward metric, Backward metric and branch transition probability, respectively. These three quantities are kind of probabilities computed on the basis of the following equations:

$$\alpha_k^j(m) = h_\alpha \sum_{m'} \sum_{j=0}^{1} \gamma_i(R_k, m', m) \alpha_{k-1}^j(m') \quad (2)$$

$$\beta_k(m) = h_\beta \sum_{m'} \sum_{i=0}^{1} \gamma_i(R_{k+1}, m, m') \beta_{k+1}(m') \quad (3)$$

$$\gamma_i(R_k, m', m) = p(R_k / d_k = i, S_k = m, S_{k-1} = m') \quad (4)$$
$$q(d_k = i / S_k = m, S_{k-1} = m') \pi(S_k = m / S_{k-1} = m')$$

where $h_\alpha$ and $h_\beta$ are normalization constants.

Moreover, $R_k$ corresponds to the soft values $x_k$, $y_{1k}$ at the output of the noisy channel 102 after demodulation. With p( ) is indicated the transition probability of a discrete gaussian memoryless channel. Then, q( ) is the function that select the possible transition in a convolutional encoder finite state machine and $\pi$( ) is the transition state probability.

As known by those skilled in the art, the values $\alpha$ and $\beta$ can be recursively calculated from $\gamma$ during the trellis Forward and Backward Recursions, respectively.

If we apply the logarithm operator to the branch transition probability $\gamma$, we obtain a further branch transition probability $\hat{\gamma}$ expressed as:

$$\hat{\gamma}(R_k, m', m)_i = \log \gamma(_i(R_k, m', m)) =$$

$$\log[p(R_k / d_k = i, S_k = m, S_{k-1} = m') q(d_k = i / S_k = m, S_{k-1} = m')] +$$

$$\log(\pi(S_k = m / S_{k-1} = m')) \quad (5)$$

then, the Forward $\alpha$ and Backward $\beta$ metrics can be expressed as further Forward $\hat{\alpha}$ and Backward $\hat{\beta}$ metrics $$\hat{\alpha}_k^j(m) = \log\left(h_\alpha \sum_{m'} \sum_{j=0}^{1} \exp(\hat{\gamma}_i(R_k, m', m)) \exp(\hat{\alpha}_{k-1}^j(m'))\right) = \quad (6)$$

$$= \log\left(\sum_{m'} \sum_{j=0}^{1} \exp(\hat{\gamma}_i(R_k, m', m) + \hat{\alpha}_{k-1}^j(m'))\right) + H_\alpha$$

$$\hat{\beta}_k(m) = \log\left(\sum_{m'} \sum_{i=0}^{1} \exp(\hat{\gamma}_i(R_{k+1}, m, m') + \hat{\beta}_{k+1}(m'))\right) + H_\beta \quad (7)$$

where the terms $H_\alpha$ and $H_\beta$ correspond to the above indicated normalization constants $h_\alpha$ and $h_\beta$ and the first log-likelihood ratio $\Lambda_1(d_k)$, can be expressed as:

$$\Lambda_1(d_k) = \log \frac{P_r(d_k = 1 / \text{observation})}{P_r(d_k = 0 / \text{observation})} = \quad (8)$$

$$= \log \frac{\sum_m \sum_{m'} \sum_{j=0}^{1} \exp\left(\begin{array}{c} \hat{\gamma}_1(R_k, m', m) + \\ \hat{\alpha}_{k-1}^j(m') + \hat{\beta}_k(m) \end{array}\right)}{\sum_m \sum_{m'} \sum_{j=0}^{1} \exp\left(\begin{array}{c} \hat{\gamma}_0(R_k, m', m) + \\ \hat{\alpha}_{k-1}^j(m') + \hat{\beta}_k(m) \end{array}\right)} =$$

$$= \log\left(\sum_m \sum_{m'} \sum_{j=0}^{1} \exp\left(\begin{array}{c} \hat{\gamma}_1(R_k, m', m) + \\ \hat{\alpha}_{k-1}^j(m') + \hat{\beta}_k(m) \end{array}\right)\right) -$$

$$= \log\left(\sum_m \sum_{m'} \sum_{j=0}^{1} \exp\left(\begin{array}{c} \hat{\gamma}_0(R_k, m', m) + \\ \hat{\alpha}_{k-1}^j(m') + \hat{\beta}_k(m) \end{array}\right)\right)$$

$$= \Lambda\_1 - \Lambda\_2$$

It should be observed that the quantities in (6), (7) and (8) can be computed by solving recursively terms such as the following:

$$\log(\exp(a_1 + a_2)) = \max(a_1, a_2) + \log(1 + e^{-|a_1 - a_2|}) = \max^*(a_1, a_2) \quad (9)$$

where the operator $\max^*(a_1, a_2)$ comprises a max operator between general quantities $a_1$, and $a_2$ and a correcting factor log $(1+e^{-|a_1-a_2|})$ that is function (in particular, a transcendent function) of the modulus of the difference between the same quantities.

As an example, the recursion to compute the further Forward metric $\hat{\alpha}$ will be performed by a recursive application of equation (9) where the arguments will be terms like:

$$\hat{\gamma}_i(R_k, m', m) + \hat{\alpha}_{k-1}^j(m')$$

On the contrary, the computation of ratio $\Lambda_1$ will be performed by two independent recursive application of equation (9) where the arguments will be terms like:

$$(\hat{\gamma}_1(R_k, m', m) + \hat{\alpha}_{k-1}^j(m') + \hat{\beta}_k(m))$$

Advantageously, to approximate the correcting factor log(1+ $e^{-|a_1-a_2|}$) a Look-Up Table or LUT is adopted.

Such LUT could be memorized in the memory unit 500 provided in the turbo decoder 300 and, for example, it can be generated by a processor external to the turbo decoder 300 and downloaded into the decoder itself during data processing of the input data. Alternatively, the LUT can be generated within the decoder 301.

It should be observed that the number of elements of the LUT depends on the metric representation precision. Accordingly, we assume that the further branch transition probabilities $\hat{\gamma}$ are digitized according to the formula:

$$\hat{\gamma}_q = \text{round}(\hat{\gamma} 2^p) \quad (10)$$

where p is the number of bits dedicated to the precision or equivalently 2-p is the quantization interval.

Then, assuming that a saturation is applied and considering that a limited number of bits is available in any real implementation:

$$\begin{cases} \hat{\gamma}_q \geq 2^{(p+d-1)} \Rightarrow \hat{\gamma}_q = 2^{(p+d-1)} - 1 \\ \hat{\gamma}_q \leq -2^{(p+d-1)} \Rightarrow \hat{\gamma}_q = -2^{(p+d-1)} \end{cases} \quad (11)$$

where d is the number of bit dedicated to the signal dynamic and p+d is equal to the number of ADC bits as known by those skilled in the art.

Consequently, each element in the LUT can be defined as:

$$\text{LUT}(\Delta) = \text{round}(\log(1+\exp(-\Delta/2^p))2^p) \quad (12)$$

where $$\Delta = |\hat{\gamma}_{q1} - \hat{\gamma}_{q2}|$$

and the round operator represents the nearest integer. Each value LUT($\Delta$) represents the correcting factor of the max* $(a_1, a_2)$ operator expressed by the formula (9).

Generally, the LUT has a limited number of elements given by the maximum integer $\Delta_{max}$ that satisfies the following inequality:

$$\log(1+\exp(-\Delta_{max}/2^p)) \geq 2^{-(p+1)} \quad (13)$$

For example, the LUT obtainable for a level of precision p=1 is shown in Table 1.

TABLE 1

| | P = 1 | | | | |
|---|---|---|---|---|---|
| LUT ($\Delta$) | 1 | 1 | 1 | 1 | 1 |
| $\Delta$ | 0 | 1 | 2 | 3 | 4 |

The argument $\Delta$ of the LUT in table 1 can varies within a limited range having $\Delta_{max}=4$ as maximum limit. Each tabled value is associated to a corresponding value of the argument $\Delta$.

The following Table 2 shows the tabled values of the LUTs for the level of precision p=2 and p=3. The values of the argument $\Delta$ are not shown in Table 2 for seek of clarity.

TABLE 2

| P | LUT |
|---|---|
| 2 | 3; 2; 2; 2; 1; 1; 1; 1; 1 |
| 3 | 6; 5; 5; 4; 4; 3; 3; 3; 3; 2; 2; 2; 2; 1; 1; 1; 1; 1; 1; 1; 1 |

Neglecting the correcting factor $\log(1+e^{-|i_1-a_2|})$ in (9) the Log-MAP algorithm becomes the well-known Max-Log-MAP algorithm. Particularly, such Max-Log-MAP algorithm presents a loss of performances compared to the Log-MAP. In fact, o the Max-Log-MAP algorithm requires an increase of abut 0.3-0.4 dB of signal-to-noise ratio to achieve the same BER (Bit error Rate) given by Log-MAP.

According to the example described, the computing module 401 computes the further branch transition probabilities $\hat{\gamma}$ and, also, it computes the further Forward $\hat{\alpha}$ and Backward $\hat{\beta}$ metrics and the first log-likelihood ratio $\Lambda_1(d_k)$ in accordance with equations (6), (7) and (8).

Figure 5:
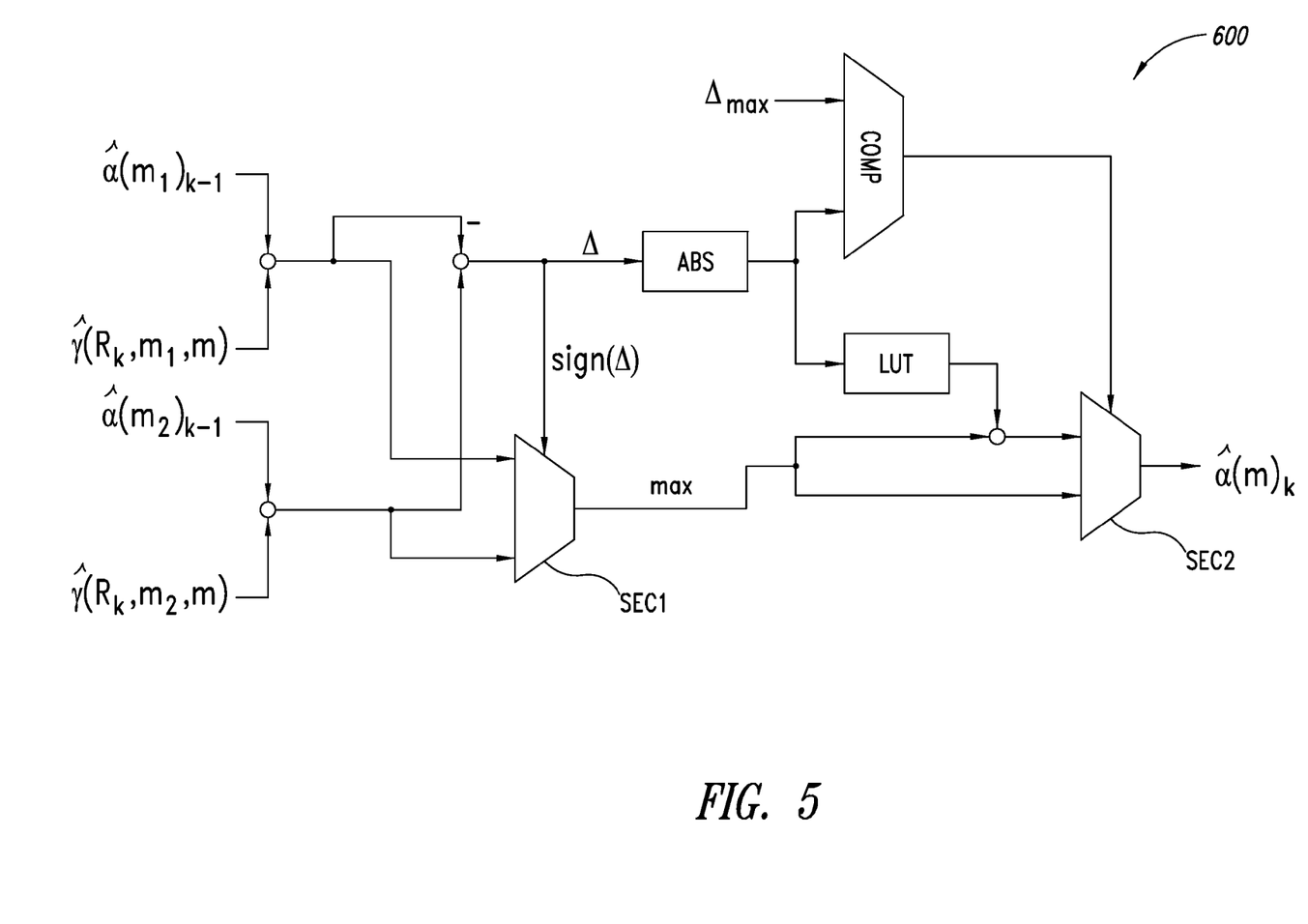
FIGS. 5 and 6 show flow diagrams indicating operations accomplished to evaluate metrics according to standard approaches.

As an example, FIG. 5 shows a first architecture 600 illustrating the operations implemented to compute the value of the further Forward metric $\hat{\alpha}$ at time k in accordance with equation (6), the max*( ) algorithm and by employing the LUT. Such architecture 600 is known in the art.

In FIG. 5, adding and subtracting nodes are shown which are necessary for the computing of the argument $\Delta$. Moreover, the first architecture 600 includes a first selector SEL1 for evaluating the term max of the max*( ) algorithm.

Another branch of the first architecture 600 shows the operations performed to compute the modulus of argument $\Delta$ (ABS) to be compared with $\Delta_{max}$ and the use of the LUT in such a way to obtain the correcting factor of the max* algorithm. The correcting factor is then added, by means of a corresponding node, to the max term.

Further, a second selector SEL2 can generate the value of further Forward metric $\hat{\alpha}$ by selection of max and max*.

The further Backward metrics $\hat{\beta}$ are computed in an analogous way.

Figure 6:
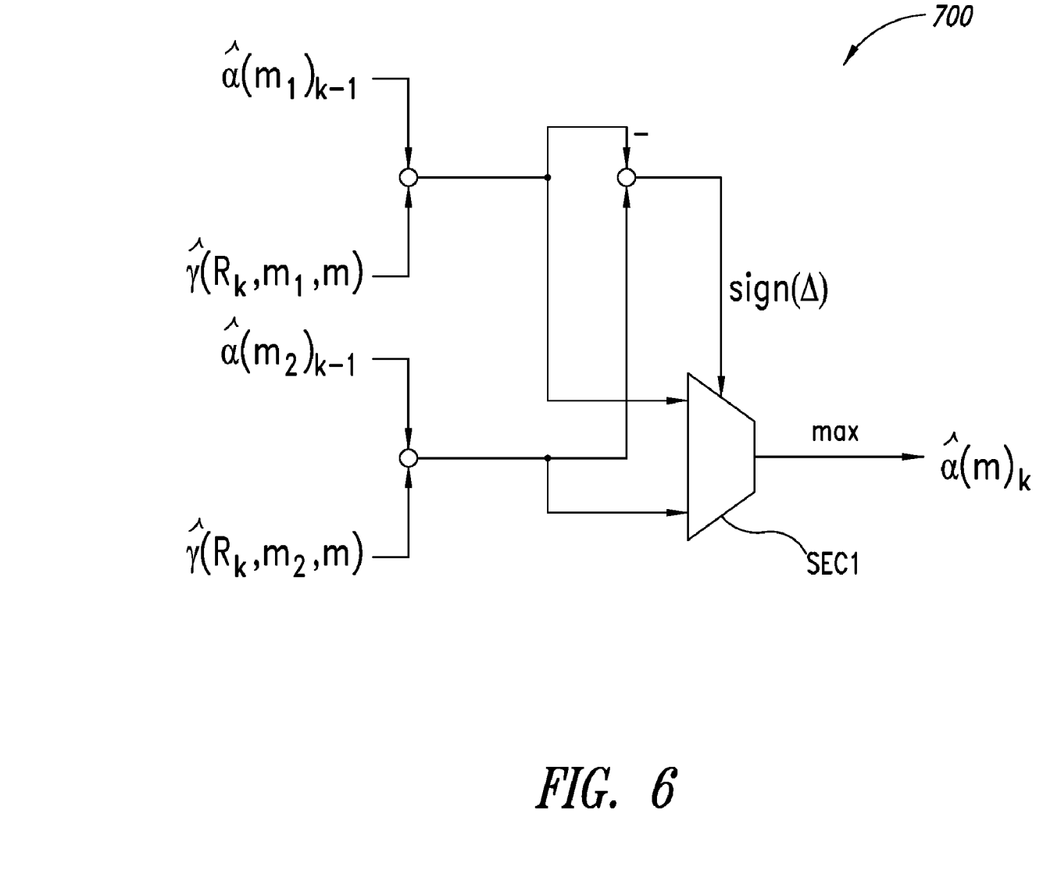

Moreover, FIG. 6 shows a second architecture 700 illustrating the operations implemented to compute a value of the further Forward metric $\hat{\alpha}$ at time k in accordance with equation (6), the max*( ) algorithm and without employing the LUT. Such second architecture 700 is known in the art.

Compared with the first architecture 600 of FIG. 5, such second architecture 700 comprises only a first selector SELL for evaluating the term max of the max*( ) algorithm.

Such term max corresponds to the further Forward metric $\hat{\alpha}$ at time k of iteration.

Figure 7:
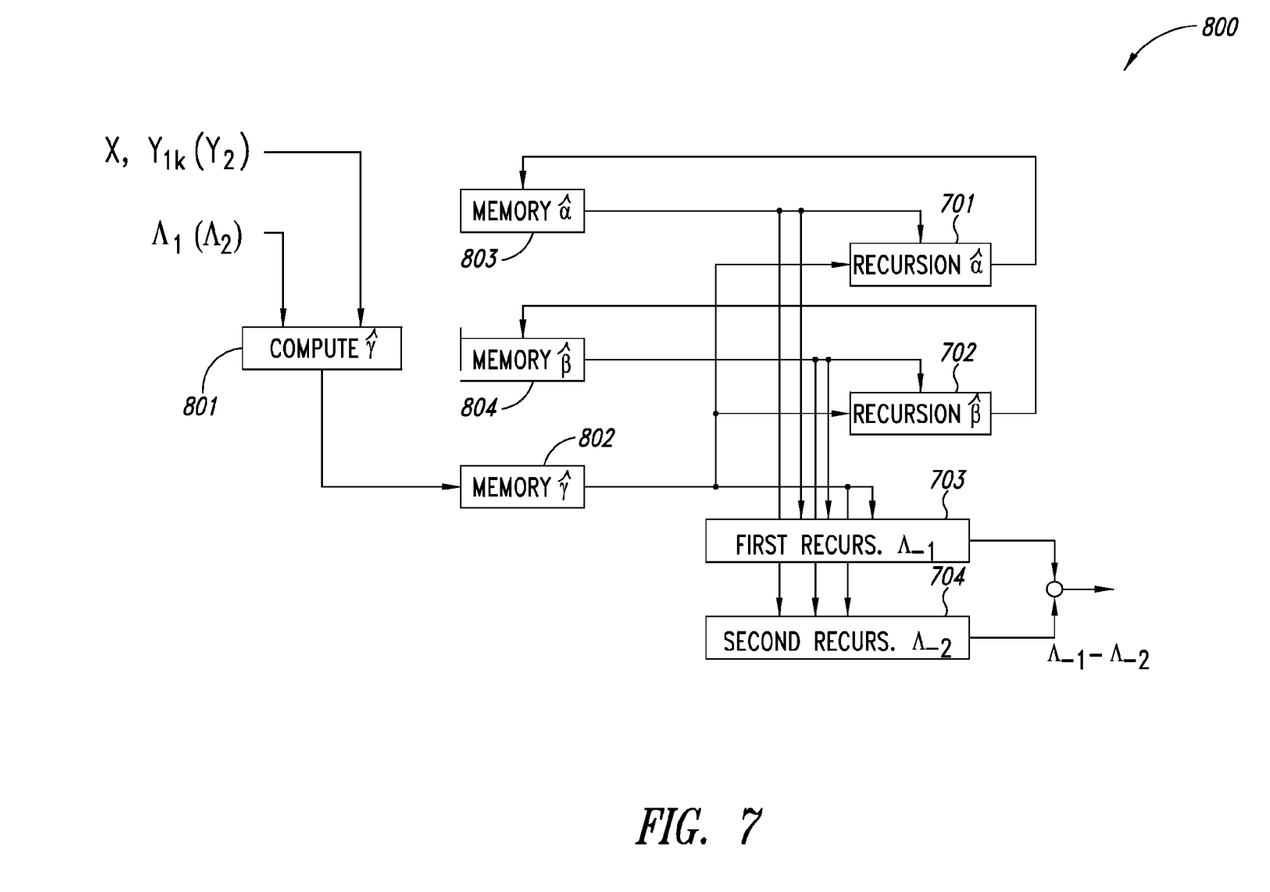
FIG. 7 schematically shows a flow diagram specifying recursion actions accomplished in the decoder of FIG. 3.

Furthermore, FIG. 7 shows a further architecture 800 illustrating the operations performed by the first decoder 301 for computing the log-likelihood ratio $\Lambda_1(d_k)$.

On the basis of the systematic bit x and the first parity bit $y_1$ and on the basis of a value of a log-likelihood ratio $\Lambda_1$, evaluated on a previous recursion step, a computing module 801 gives the further branch transition probability $\hat{\gamma}$ which is stored in a corresponding first memory module 802.

The architecture 800 includes recursion modules 701, 702, 703 and 704 for computing, respectively, the further Forward metrics $\hat{\alpha}$, the further Backward metrics $\hat{\beta}$ and the first $\Lambda\_1$ and second $\Lambda\_2$ terms of the expression (8).

The recursion module 701 has been already described with reference to FIGS. 5 and 6, Each of the other recursion modules 702, 703 and 704 are analogous to the module 701 and therefore they are not described in detail. During the recursive processing the values of the further Forward $\hat{\alpha}$ and Backward $\hat{\beta}$ metrics are stored in respective memory modules 803 and 804, In a first embodiment of the inventive method for performing the iterative decoding, the first decoder 301 implements the Log-MAP decoding algorithm using the LUT to calculate the further Forward metric $\hat{\alpha}$, i.e. to approximate the correcting factor which appears whether equation (6) is expressed as in (9).

In other words, the first decoder 301 calculates the further Forward metric $\hat{\alpha}$ approximating the correcting factor with the retrieved value of the LUT corresponding to an argument $\Delta$.

On the contrary, the further Backward metric $\hat{\beta}$ in (7) and the log-likelihood ratio $\Lambda_1(d_k)$ in (8) are calculated implementing the Max-Log-MAP decoding algorithm, i.e. neglecting the corresponding correcting factors.

In a second embodiment of the inventive method, the first decoder 301 uses the LUT to approximate the correcting factor referred to equation (7) to calculate the further Backward metric $\hat{\beta}$. Instead, the further forward metric $\hat{\alpha}$ in (6) and the log-likelihood ratio $\Lambda_1(d_k)$ in (8) are calculated neglecting the correcting factors.

In a third embodiment of the inventive method, the first decoder 301 uses the LUT to approximate the correcting factors referred to equations (6) and (7) in order to calculate the further Forward $\hat{\alpha}$ and Backward $\hat{\beta}$ metrics. In this case, the log-likelihood ratio $\Lambda_1(d_k)$ is calculated neglecting the correcting factor.

In a fourth embodiment of the inventive method, the first decoder 301 uses the LUT to approximate the correcting factor referred to equation (8) to calculate the log-likelihood ratio $\Lambda_1(d_k)$. The further Forward $\hat{\alpha}$ and Backward $\hat{\beta}$ metrics in (6) and in (7), respectively, are calculated neglecting the correcting factors.

In a fifth embodiment of the inventive method, the first decoder 301 uses the LUT to approximate the correcting factors referred to equations (6) and (8) to calculate the further Forward $\hat{\alpha}$ metric and the log-likelihood ratio $\Lambda_1(d_k)$, respectively. In this case, the Backward metric $\hat{\beta}$ in (7) is calculated neglecting the correcting factor.

In a sixth embodiment of the inventive method, the first decoder 301 uses the LUT to approximate the correcting factors referred to equations (7) and (8) to calculate the further Backward metric $\hat{\beta}$ and the log-likelihood ratio $\Lambda_1(d_k)$, respectively. In this case, the Forward $\hat{\alpha}$ metric in (6) is calculated neglecting the correcting factor.

It should be observed that the inventive method performs the known Log-MAP algorithm when the further Forward metric $\hat{\alpha}$, the further Backward metric $\hat{\beta}$ and the log-likelihood ratio $\Lambda_1(d_k)$ are evaluated by decoder 301 approximating the corresponding correcting factors using LUT. On the contrary, neglecting all the correcting factors for evaluating $\hat{\alpha}$, $\hat{\beta}$ and $\Lambda_1(d_k)$, the method of invention performs the Max-Log-MAP algorithm.

Advantageously, the different embodiments of the method of the present invention are decoding algorithms each showing intermediate complexity and performances between the Log-MAP and Max-Log-MAP algorithms.

In fact, using LUTs for computing the further Forward metric $\hat{\alpha}$, the further Backward metric $\hat{\beta}$ and the log-likelihood ratio $\Lambda_1(d_k)$ corresponds to the optimum in terms of performance with highest computational complexity needs (Log-MAP case).

On the opposite, i.e. LUTs are not used at all (Max-Log-MAP case), advantages in reduced computational complexity are paid in terms of decoding very low performances.

For example, in Table 3 a comparison in terms of complexity and performances for each embodiment of the method of invention, the Log-MAP and Max-Log-MAP algorithms are proposed.

Particularly, the applicant has made a profiling text with a proprietary VLIW (Very Long Instruction Word) Digital Signal Processor to obtain the listed results in Table 3, Particularly, the test reports the case of a PCCC turbo code with 8 decoding iterations.

Furthermore, the complexity is measured in terms of clock cycles required by the decoding process and the performances in term of Bit Error Rate (BER).

TABLE 3

| Decoding Algorithm | Performance BER = $10^{-5}$ | Complexity [cycles] |
|---|---|---|
| Max-Log-MAP algorithm | REF | 100% |
| Algorithm 1 | ≈+0.1 dB | ≈150% |
| Algorithm 2 | ≈+0.1 dB | ≈160% |
| Algorithm 3 | ≈+0.22 dB | ≈200% |
| Algorithm 4 | ≈+0.2 dB | ≈420% |
| Algorithm 5 | ≈+0.3 dB | ≈470% |
| Algorithm 6 | ≈+0.3 dB | ≈460% |
| Log-MAP algorithm | ≈+0.4 dB | ≈510% |

As can be seen, the decoding algorithms 1 to 6 of the proposed method have complexity greater than Max-Log-MAP algorithm because they make use of LUTs.

In addition, while algorithms from 1 to 3 present less than 100% of complexity increasing, algorithms from 4 up to 7 have different level of complexity an unreasonable increase higher than 400%.

These data are justified basing on the different number of LUT accesses needed to compute the further Forward metric $\hat{\alpha}$, the further Backward metric $\hat{\beta}$ and the log-likelihood ratio $\Lambda_1(d_k)$.

Even if the above description refers to the case in which the teachings of the invention are implemented only into the first decoder 301, it has to be pointed out that such teachings can be applied alternatively, or preferably, in addition also to the second decoder 302.

Advantageously, the second decoder 302 is so as to perform the computing of quantities analogous to the above described metrics $\alpha$, $\beta$ and the log-likelihood ratio $\Lambda$ in accordance with the method above described with reference to the first decoder 301. To this end, a further Look-Up Table, analogous to the LUT employed in the described method, can be created and employed by the second decoder 302 or, alternatively, the second decoder 302 can employ the same Look-Up Table of the first decoder 301, It should be observed that different decoders each suitable to implement one of the algorithms of the inventive method can be provided. In this way, the complexity analysis can be expressed in terms of hardware implementations, i.e. in terms of silicon area, power consumption and achievable speed.

Advantageously, the algorithms of the inventive method can be used for both Parallel and Serial Turbo decoding.

Furthermore, the method of invention shows flexibility to achieve the most suitable trade-off between performances and computational complexity.

Obviously, to the decoding method and apparatus of the present invention, those skilled in the art, aiming at satisfying contingent and specific requirements, may carry out further modifications and variations, all however being contemplated within the scope of protection of the invention, such as defined in the annexed claims.

We claim:

1. A method for performing iterative decoding in accordance with a Log-MAP algorithm in a system using a turbo code, the method comprising:
   generating a look-up table stored in a memory comprising a plurality of values corresponding to a transcendent function representative of a correcting factor of a max* algorithm;
   performing a first calculation to obtain a forward metric;
   performing a second calculation to obtain a backward metric;
   performing a third calculation to obtain a log-likelihood ratio for every information bit to be decoded,
   wherein among said performed calculations at least one and no more than two calculations are performed by the use of said look-up table for implementing the Log-MAP decoding algorithm and the remaining calculations are performed implementing a Max Log-MAP decoding algorithm, wherein said step of generating the look-up table comprises the further step of generating each value according to the following equation:

$$LUT(\Delta)=\text{round}(\log(1\exp(-\Delta/2^p))2^p);$$

where p is a factor corresponding to a number of bits dedicated to the precision of the value $LUT(\Delta)$ and $\Delta$ is indicative of an argument varying within a range having a maximum limit $\Delta_{max}$.

2. A method according to claim 1, wherein performing the first calculation to obtain the forward metric includes using the look-up table for implementing the Log-MAP decoding algorithm and the second and third calculations include implementing the corresponding Max-Log-MAP decoding algorithms.

3. A method according to claim 1, wherein performing the second calculation to obtain the backward metric includes using the look-up table for implementing the Log-MAP decoding algorithm and the first and third calculations include implementing the corresponding Max-Log-MAP decoding algorithms.

4. A method according to claim 1, wherein performing the first and second calculations to obtain the forward and backward metrics include using the look-up table for implementing the Log-MAP decoding algorithms and the third calculation includes implementing the corresponding Max-Log-MAP decoding algorithm.

5. A method according to claim 1, wherein performing the third calculation to obtain the log-likelihood ratio includes using the look-up table for implementing the Log-MAP decoding algorithm and the first and second calculations include implementing the corresponding Max-Log-MAP decoding algorithms.

6. A method according to claim 1, wherein performing the first and third calculations to obtain the forward metric and the log-likelihood ratio include using the look-up table for implementing the Log-MAP decoding algorithms and the second calculation includes implementing the corresponding Max-Log-MAP decoding algorithm.

7. A method according to claim 1, wherein performing the second and third calculations to obtain the, backward metric and the log-likelihood ratio include using the look-up table for implementing the Log-MAP decoding algorithms and the first calculation includes implementing the corresponding Max-Log-MAP decoding algorithm.

8. A method according to claim 1, wherein implementing the Log-MAP decoding algorithm includes the step of estimating a first function $\log(\exp(a_1+a_2))$ by computing a second function $\max(a_1,a_2)$ and evaluating the correcting factor $\log(1+e^{-|a_1-a_2|})$ where $a_1$ and $a_2$ are parameters correlated either to the forward and backward metrics and to the log-likelihood ratio.

9. A method according to claim 8, wherein said step of evaluating the correcting factor $\log(1+e^{-|a_1-a_2|})$ includes the further step of retrieving a value of the look-up table on the basis of the factor p and the argument $\Delta$.

10. A method according to claim 9, wherein implementing the Max-Log-MAP decoding algorithm includes the step of estimating only the second function $\max(a_1,a_2)$.

11. A method according to claim 1, wherein such system is a digital communication system.

12. A method according to claim 1, wherein such system is a data storage system.

13. A method according to claim 11, further comprising the steps of:
   receiving a first and a second soft values produced by a turbo encoder representing information transmitted on a communication channel, the first soft value corresponding to a transmitted bit to be decoded;
   computing the log-likelihood ratio by an iterative processing in a first decoder on the basis of the forward and backward metrics and on the basis of said first and a second soft values;
   feeding an interleaver with the calculated log-likelihood ratio to obtain an interleaved log-likelihood ratio.

14. A method according to claim 13, further comprising:
   receiving a third soft value produced by the turbo encoder representing further information transmitted on the communication channel;
   feeding a second decoder with said interleaved log-likelihood ratio and said third soft value to generate a first output quantity and a second quantity;
   feeding a first deinterleaver with the second quantity obtaining a feedback quantity;
   supplying said feedback quantity to the first decoder;
   supplying to a second deinterleaver the first output quantity to generate a deinterleaved quantity;
   starting from said deinterleaved quantity to generate a decoded bit corresponding to the transmitted bit.

15. A receiving apparatus comprising a first decoder for performing in a system iterative decoding of information coded by an error correction code, the first decoder comprising:
   a memory storing a look-up table comprising a plurality of tabled values $LUT(\Delta)$ associated with corresponding arguments, wherein the tabled values $LUT(\Delta)$ of the look-up table are equal to:

$$\text{round}(\log(1+\exp(-\Delta/2^p))2^p)$$

where p is a factor corresponding to a number of bits dedicated to the precision of the value LUT($\Delta$) and $\Delta$ is indicative of an argument varying within a range having a maximum limit $\Delta_{max}$;

a processor module for performing information decoding and retrieving said tabled values from the look-up table on the basis of corresponding arguments, said processor module being configured for:

performing a first calculation to obtain a forward metric;

performing a second calculation to obtain a backward metric;

performing a third calculation to obtain a log-likelihood ratio for every information bit to be decoded, wherein among said performed calculations at least one and no more than two calculations are performed by the use of said look-up table for implementing the Log-MAP decoding algorithm and the remaining calculations are performed implementing a Max-Log-MAP decoding algorithm.

16. A receiving apparatus according to claim 15, wherein said processor module is configured to read the look-up table for computing a correcting factor of the Log-MAP algorithm.

17. A receiving apparatus according to claim 15, said first decoder further comprising an input for receiving a first ($x_k$) and a second ($y_k$) soft values produced by a turbo encoder representing information transmitted on a communication channel, the first soft value corresponding a transmitted bit to be decoded; the processor module being configured to compute the log-likelihood ratio by an iterative processing on the basis of the forward and backward metrics and on the basis of said first and a second soft values.

18. A receiving apparatus according to claim 17, further comprising an interleaver for elaborating the calculated log-likelihood ratio to obtain an interleaved log-likelihood ratio.

19. A receiving apparatus according to claim 18, wherein said input is so as to receive a third soft value produced by a turbo encoder representing further information transmitted on the communication channel.

20. A receiving apparatus according to claim 19, further comprising:
a second decoder for elaborating said interleaved log-likelihood ratio and said third soft value to generate a first output quantity and a second quantity;
a first deinterleaver of the second quantity for obtaining a feedback quantity; said feedback quantity being to be supplied to said first decoder.

21. A receiving apparatus according to claim 20, further comprising:
a second interleaver to be feed with the first output quantity and generate an interleaved quantity,
a threshold module for generating a decoded bit corresponding to the transmitted bit, starting from said interleaved quantity.

22. A method, comprising: generating a look-up table stored in a memory comprising a plurality of values corresponding to a transcendent function representative of a correcting factor of a max* algorithm, wherein generating the look-up table comprises generating each value according to the following equation:

$$\text{LUT}(\Delta)=\text{round}(\log(1+\exp(-\Delta/2^p))2^p)$$

where p is a factor corresponding to a number of bits dedicated to the precision of the value LUT($\Delta$) and $\Delta$ is indicative of an argument varying within a range having a maximum limit $\Delta_{max}$ performing iterative decoding of an input communication signal in accordance with a Log-MAP algorithm in a system using a turbo code; and performing iterative decoding of an incoming communication signal in accordance with a Log-Map algorithm in the system using a turbo code, wherein performing iterative decoding includes performing a first calculation using said look-up table for implementing the Log-MAP decoding algorithm.

23. A method according to claim 22 wherein performing iterative decoding includes:
obtaining a forward metric by performing the first calculation; and
performing a second calculation to obtain a backward metric, wherein performing the second calculation includes implementing a Max Log-MAP decoding algorithm.

24. A method according to claim 22, wherein performing iterative decoding includes:
obtaining a forward metric by performing the first calculation; and
performing a second calculation to obtain a log-likelihood ratio for every information bit to be decoded, wherein performing the second calculation includes implementing a Max Log-MAP decoding algorithm.

25. A method according to claim 22, wherein performing iterative decoding includes:
obtaining a forward metric by performing the first calculation; and
performing a second calculation to obtain a backward metric, wherein performing the second calculation includes using said look-up table for implementing the Log-MAP decoding algorithm; and
performing a third calculation to obtain a log-likelihood ratio for every information bit to be decoded, wherein performing the third calculation includes implementing a Max Log-MAP decoding algorithm.

26. A method according to claim 22, wherein implementing the Log-MAP decoding algorithm includes the step of estimating a first function $\log(\exp(a_1+a_2))$ by computing a second function $\max(a_1,a_2)$ and evaluating a correcting factor $\log(1+e^{-|a_1-a_2|})$ where $a_1$ and $a_2$ are parameters correlated either to the forward and backward metrics and to the log-likelihood ratio.

* * * * *

UNITED STATES PATENT AND TRADEMARK OFFICE
CERTIFICATE OF CORRECTION

PATENT NO. : 7,770,092 B2  Page 1 of 1
APPLICATION NO. : 11/323909
DATED : August 3, 2010
INVENTOR(S) : Andrea Concil et al.

It is certified that error appears in the above-identified patent and that said Letters Patent is hereby corrected as shown below:

Column 11
Claim 1, Line 38, "$LUT(\Delta) = round(log(1exp(-\Delta/2^p))2^p)$" should read as
--$LUT(\Delta) = round(log(1 + exp(-\Delta/2^p))2^p)$--.

Column 12
Claim 7, Line 8, "second and third calculations to obtain the, backward metric" should read as
--second and third calculations to obtain the backward metric--.

Claim 10, Line 24, "A method according to claim 9, wherein implementing" should read as
--A method according to claim 8, wherein implementing--

Signed and Sealed this

Twenty-first Day of December, 2010

David J. Kappos
*Director of the United States Patent and Trademark Office*